(12) United States Patent
Wei et al.

(10) Patent No.: US 7,450,681 B2
(45) Date of Patent: Nov. 11, 2008

(54) SHIFT REGISTER

(75) Inventors: Chun-Ching Wei, Taipei (TW);
Wei-Cheng Lin, Taichung County (TW);
Shih-Hsun Lo, Hsinchu County (TW);
Yang-En Wu, Taipei (TW)

(73) Assignee: AU Optronics Corp., Hsin-Chu (TW)

( * ) Notice: Subject to any disclaimer, the term of this patent is extended or adjusted under 35 U.S.C. 154(b) by 51 days.

(21) Appl. No.: 11/456,561

(22) Filed: Jul. 10, 2006

(65) Prior Publication Data

US 2007/0188436 A1 Aug. 16, 2007

(30) Foreign Application Priority Data

Feb. 10, 2006 (TW) .............................. 95104594 A

(51) Int. Cl.
*H03K 5/22* (2006.01)

(52) U.S. Cl. ............................. 377/64; 377/72; 345/100

(58) Field of Classification Search ........................ None
See application file for complete search history.

(56) References Cited

U.S. PATENT DOCUMENTS

| | | | | |
|---|---|---|---|---|
| 5,926,520 A * | 7/1999 | Yano | ............................ | 377/80 |
| 6,057,719 A * | 5/2000 | Austin et al. | ................. | 327/117 |
| 6,459,310 B1 * | 10/2002 | Thomson et al. | ............. | 327/115 |
| 6,845,140 B2 * | 1/2005 | Moon et al. | ..................... | 377/78 |
| 6,870,895 B2 * | 3/2005 | Osame et al. | .................. | 377/78 |
| 7,116,320 B2 * | 10/2006 | Hirakawa et al. | ............ | 345/204 |
| 2005/0008114 A1 | 1/2005 | Moon | ............................ | 377/72 |
| 2006/0280278 A1 * | 12/2006 | Schabel et al. | ................. | 377/47 |

FOREIGN PATENT DOCUMENTS

JP H07-281646 10/1995
JP H08-146919 6/1996

* cited by examiner

*Primary Examiner*—Tuan T. Lam
*Assistant Examiner*—Hiep Nguyen
(74) *Attorney, Agent, or Firm*—Winston Hsu

(57) ABSTRACT

A shift register includes a signal generating circuit for generating an output signal at an output end of the shift register in response to a clock signal while the signal generating circuit is turned on, a driving circuit electrically coupled to the signal generating circuit for controlling the signal generating circuit in response to an input signal received from an input end of the shift register, a primary reset circuit electrically coupled to the signal generating circuit for turning off the signal generating circuit and resetting the output signal from the output end, and a feedback circuit electrically coupled to the output end and the major reset circuit for controlling the primary reset circuit in response to the output signal and the clock signal.

8 Claims, 8 Drawing Sheets

SHIFT REGISTER

BACKGROUND OF THE INVENTION

1. Field of the Invention

The present invention relates to a shift register, and more particularly, to a shift register capable of self-feedback.

2. Description of the Prior Art

A liquid crystal display (LCD) is a flat screen display panel that is manufactured from a glass base. A future trend of manufacturing an LCD will be by driving a control circuit that uses a thin film transistor (TFT) technology to make the glass base of the LCD whereas the current method of production utilizes an amorphous silicon layer that is far less suitable for producing high-grade transistors.

Please refer to FIG. 1 through to FIG. 3. FIG. 1 illustrates a diagram of a conventional LCD 100. FIG. 2 illustrates a diagram of a gate driving circuit 120 of the LCD 100 of FIG. 1. FIG. 3 illustrates a diagram of a shift register of the gate driving circuit 120 of FIG. 2. As illustrated in the figures, the LCD 100 includes a display array 110, and a gate driving circuit 120. The display array 110 is utilized for displaying images, and the gate driving circuit 120 is utilized for driving the display array 110. The gate driving circuit 120 includes a plurality of stage shift registers 122, the stage shift registers 122 are electrically coupled in a series connection and a gate signal GOUT is generated to drive the display array 110 in response to a first clock signal CK and a second clock signal XCK sequentially. The phase of the second clock signal XCK is opposite to the phase of the first clock signal CK. Regarding the connection of each stage shift register 122, the first clock signal CK and the second clock signal XCK alternately exchange information, which means that a clock signal input end CK1 and a clock signal input end CK2 is alternately coupled to the first clock signal CK and the second clock signal XCK. Each stage shift register 122 has an output end OUT, an input end IN, and a feedback end FB. The stage shift register 122 includes a signal generating circuit 310, a driving circuit 320, a primary reset circuit 330, and two secondary reset circuits 340, 350. As illustrated in FIG. 3, the signal generating circuit 310 is utilized for generating a gate signal GOUT(N) at the output end OUT of the shift register 122 in response to the first clock signal CK (which can also be the second clock signal XCK) while the signal generating circuit 310 is being turned on. The driving circuit 320 is utilized for controlling the signal generating circuit 310 in response to the input signal received by the input end IN of the shift register 122. The input signal received by the input end IN of the shift register 122 is the gate signal GOUT(N−1) from a previous stage shift register. The primary reset circuit 330 is utilized for turning off the signal generating circuit 310 and resetting the gate signal GOUT(N) from the output end OUT (which means that voltage of the output end is being lowered to a predetermined low electrical potential VSS), and feedback signal transmitted by the feedback end FB is a gate signal GOUT(N+1) from an output end of a previous stage shift register. The secondary reset circuits 340, 350 are utilized for alternately turning off the signal generating circuit 310 and resetting the output signal of the output end OUT in response to the first clock signal CK and the second clock signal XCK. Although the functions of the secondary reset circuits 340, 350 and the primary reset circuit 330 are quite similar, the primary reset circuit 330 differs from the secondary reset circuits 340, 350 in that it only operates after receiving a gate signal GOUT(N+1) from a next stage shift register. The secondary reset circuits 340, 350 operate continuously for long period of time. When the TFT is in operation for a long period of time, then efficient can reduced as well as its lifespan. Therefore, the primary reset circuit 330 is only operated once every operation cycle, thus noise interference can be prevented thereby prolonging the operation lifespan of the product.

To further explain the operation of the conventional shift register 122 in detail, please refer to FIG. 4 and at the same time to FIG. 3. FIG. 4 illustrates a clock diagram of each related signal of the shift register 122 of FIG. 3 during operation. As illustrated in FIG. 4, in time T1, the input signal (which can be the gate signal GOUT(N−1) or a start signal (ST) from the output end of the previous stage shift register) is being raised to a high electrical potential, hence thin film transistor (TFT) $TFT_1$ of the driving circuit 320 is initialized, which causes the signal generating circuit 310 to initialize as well. However, the first clock signal CK at T1 is at low electrical potential, the gate signal GOUT(N) from the output end OUT remains in a low electrical potential, furthermore because the feedback signal GOUT (N+1) of the feedback end FB is at low electrical potential the primary reset circuit 330 does not operate at point $N_4$ because electrical potential is low, because the first clock signal CK is at low electrical potential the secondary reset circuit 340 does not operate at point $N_2$ because electrical potential is low, and because the input signal GOUT(N−1) or ST turns on $TFT_8$ at T1 the secondary reset circuit 350 does not operate at point $N_3$ because electrical potential is low.

At time T2, the input signal GOUT(N−1) or ST received by the input end IN is being lowered to low electrical potential, thus $TFT_1$ of the driving circuit 320 is turned off, however the signal generating circuit 310 is still turned on, electrical potential is raised to high electrical potential at $N_1$ due to electric capacitance on the first clock signal CK when the first clock signal CK is raised to high electrical potential, and the gate signal GOUT(N) from the output end OUT also becomes high electrical potential. Furthermore, because $TFT_{15}$ is turned on by the first clock signal CK at T2 the primary reset circuit 330 does not operate at point $N_4$ because electrical potential is low, because $TFT_{11}$ is turned on by the gate signal GOUT(N) from the output end OUT at T2 the secondary reset circuit 340 does not operate at point $N_2$ because electrical potential is low, and because the second clock signal XCK is at low electrical potential the secondary reset circuit 350 does not operate at point $N_3$ because electrical potential is low.

At time T3, the primary reset circuit 330 turns on $TFT_{16}$, TFT17, and turns off the signal generating circuit 310 (N1 is at low electrical potential) and lowers the gate signal GOUT (N) from the output end OUT into low electrical potential, because the second clock signal XCK turns on $TFT_{14}$ and the feedback signal GOUT(N+1) of the feedback end FB rises to high electrical potential which directly causes point $N_4$ to be high electrical potential. Furthermore, because the first clock signal CK is at low electrical potential the secondary reset circuit 340 does not operate at point $N_2$ because electrical potential is low, however because the second clock signal XCK is at high electrical potential the secondary reset circuit 350 at point $N_3$ is at high electrical potential) and at the same time $TFT_3$, $TFT_6$ are being turned on, the signal generating circuit 310 is being turned off, and the gate signal GOUT(N) from the output end OUT is being lowered to low electrical potential.

Within other following time, the secondary reset circuit 340 and the secondary reset circuit 350 will operate alternately to turn off the signal generating circuit 310 and lower the gate signal GOUT(N) from the output end to low electrical potential until the input signal GOUT(N−1) of the input end IN or ST is again raised to high electrical potential. Also, a next stage shift register 122 will repeat the above-mentioned actions, thus the gate signal GOUT can be sequentially generated to drive the display array 10.

However, the gate signal GOUT from each stage shift register 122 is not only utilized for driving the display array, but also utilized for outputting to an input end IN of a next stage shift register 122 and a feedback end FB of a previous stage shift register 122, therefore the work load of the output end OUT is increased. This action also results in increasing the rising time and falling time of the gate signal GOUT from each stage shift register 122. Furthermore, a feedback end FB of a last stage shift register of the gate driving circuit 120 is unable to receive a feedback signal thus causing a primary reset circuit 330 of the last state shift circuit 122 to stop operating, which results in shortening of the operation life span of the last stage shift register 122 that can cause damage on the gate driving circuit 120.

SUMMARY OF THE INVENTION

The claimed invention discloses a shift register. The shift register comprises an output end; an input end; a signal generating circuit for generating an output signal at the output end in response to a clock signal while the signal generating circuit is turned on, a driving circuit electrically coupled to the signal generating circuit for controlling the signal generating circuit in response to an input signal from the input end, a primary reset circuit electrically coupled to the signal generating circuit for turning off the signal generating circuit and resetting an output signal from the output end, and a feedback circuit electrically coupled to the output end and the primary reset circuit for controlling the primary reset circuit in response to the output signal and the clock signal.

The claimed invention further discloses a thin film transistor (TFT) liquid crystal display (LCD). The LCD comprises a display array; and a gate driving circuit, having a plurality of stage shift registers coupled in a series, electrically connected to the display array. Each stage shift register comprises an output end; an input end; a signal generating circuit for generating an output signal at the output end of the shift register while the signal generating circuit is turned on in response to a clock signal; a driving circuit, electrically coupled to the signal generating circuit for controlling the signal generating circuit in response to an input signal from the input end; a primary reset circuit, electrically coupled to the signal generating circuit for turning off the signal generating circuit and resetting an output signal from the output end; and a feedback circuit, electrically coupled to the output end and the primary reset circuit for controlling the primary reset circuit in response to the output signal and the clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
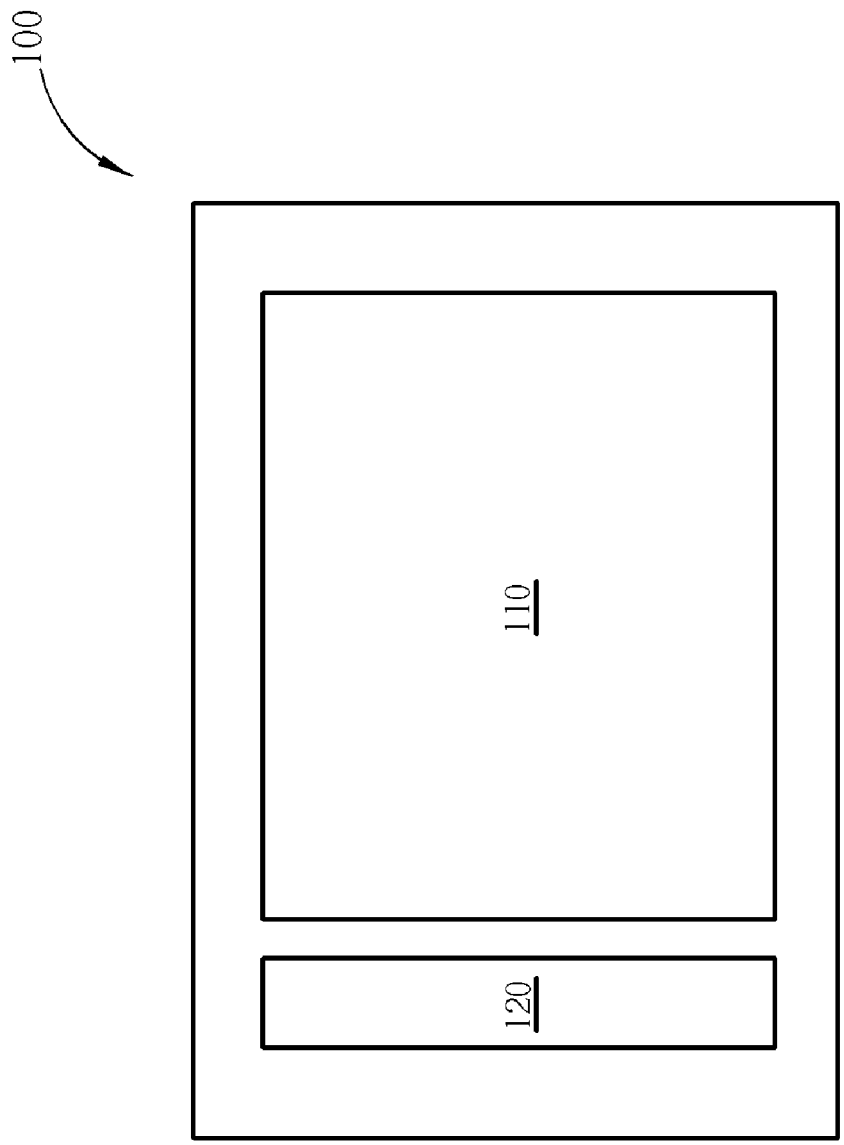
FIG. 1 illustrates a diagram of a conventional liquid crystal display (LCD).
Figure 2:
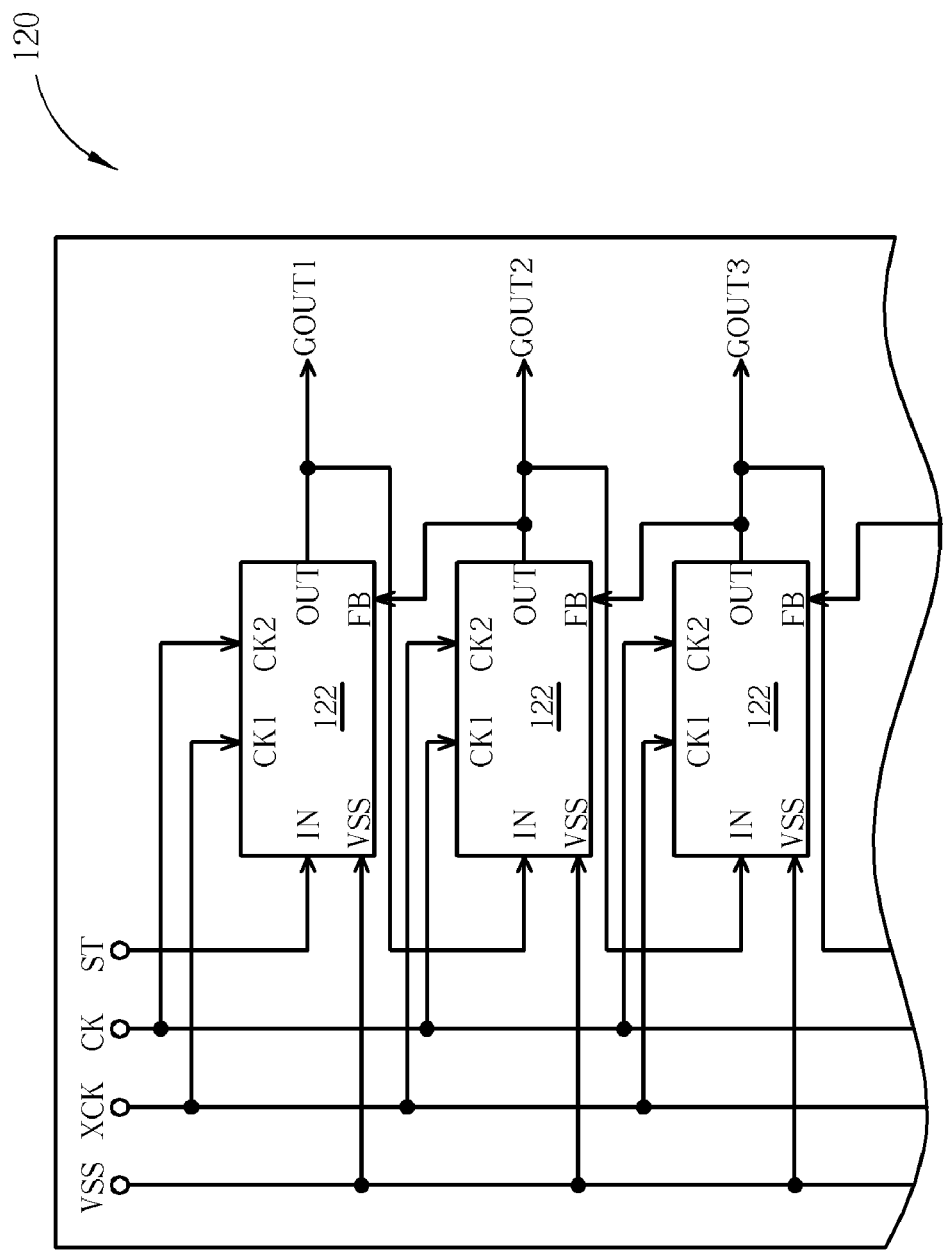
FIG. 2 illustrates a diagram of a gate driving circuit of the LCD of FIG. 1.
Figure 3:
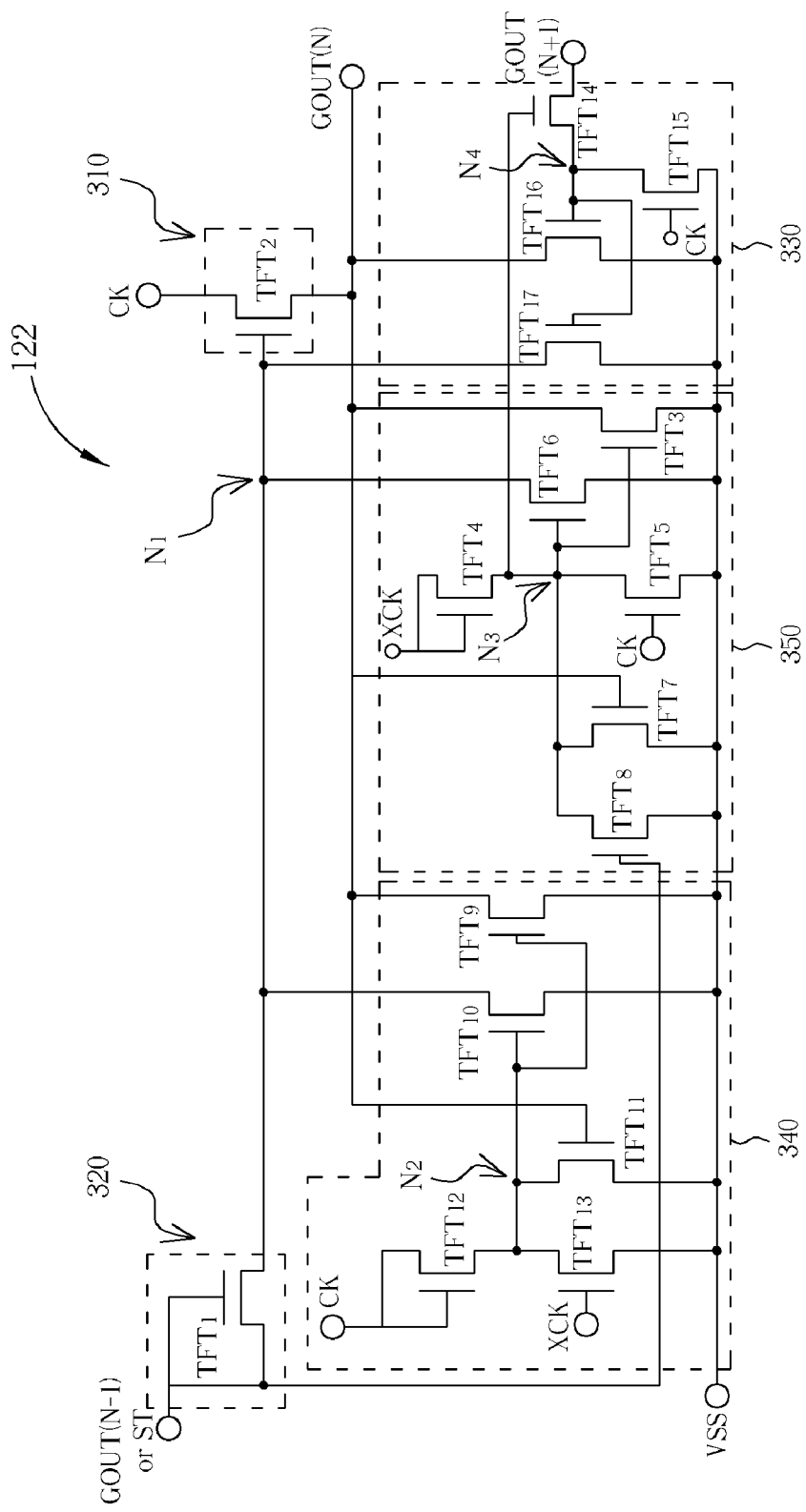
FIG. 3 illustrates a diagram of a shift register of the gate driving circuit of FIG. 2.
Figure 4:
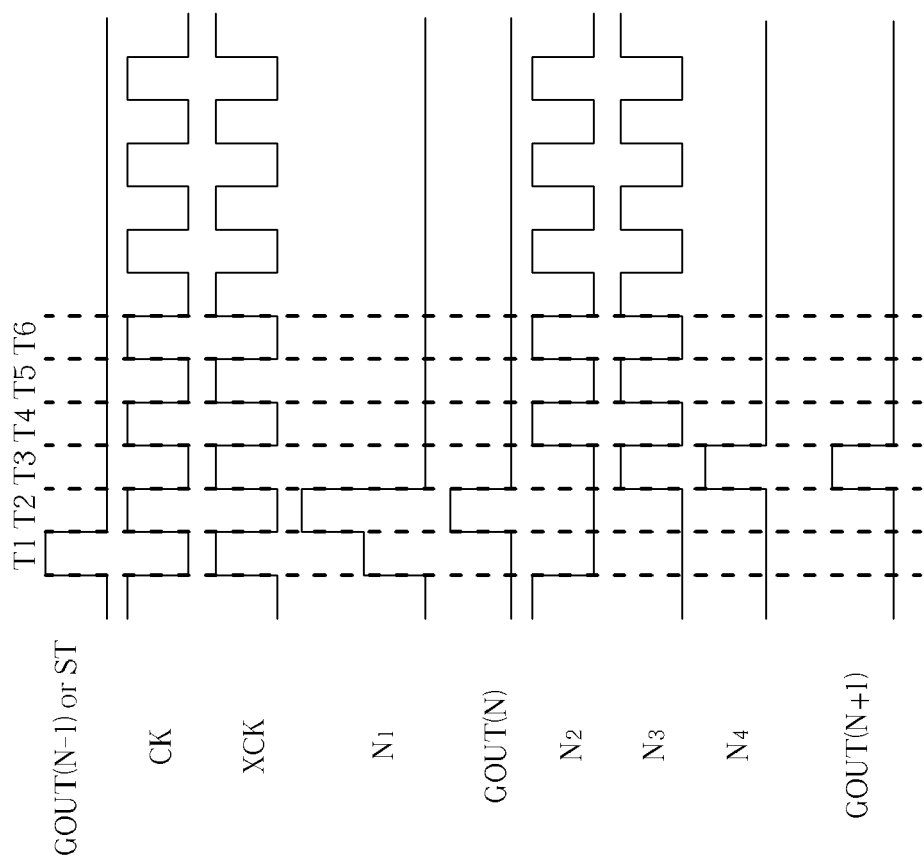
FIG. 4 illustrates a clock diagram of each related signal during operation of the shift register of FIG. 3.
Figure 5:
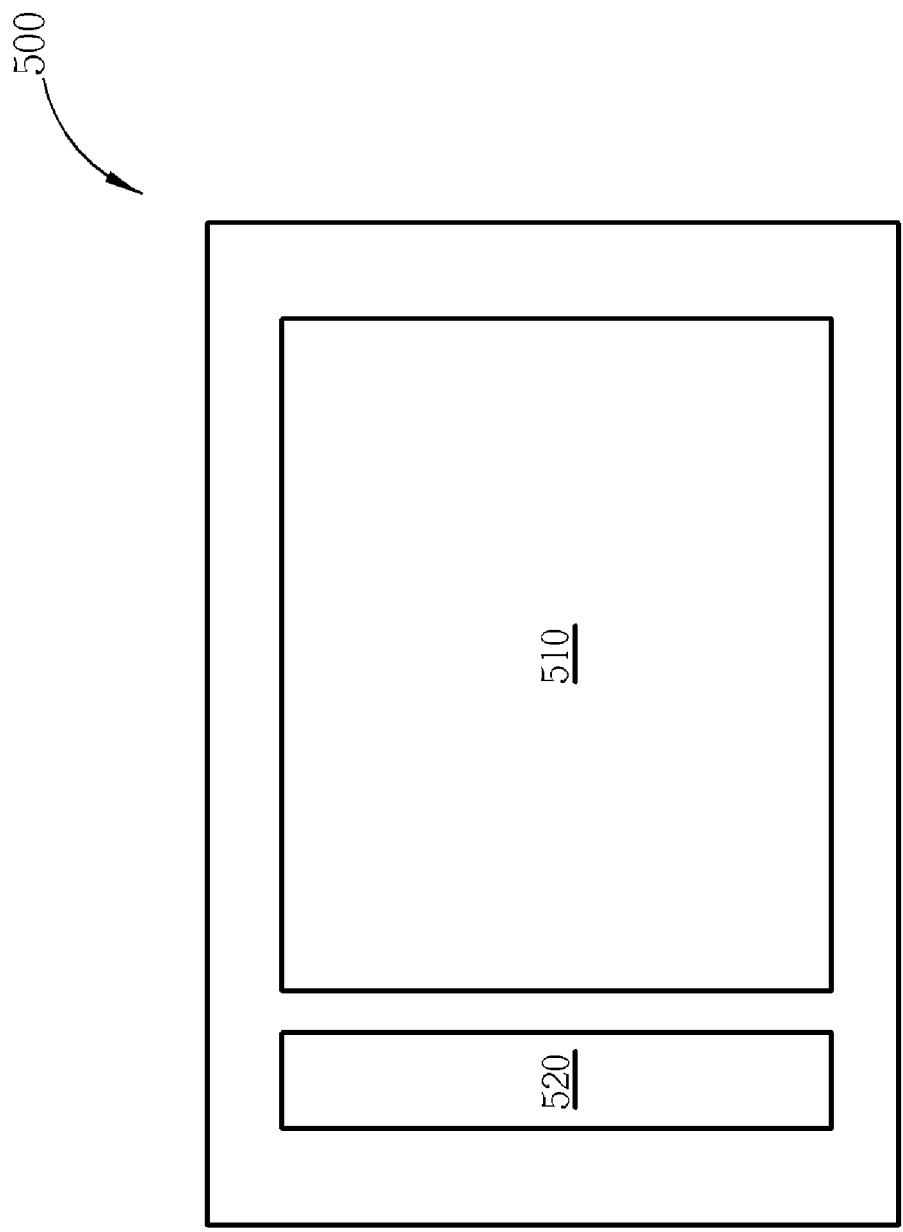
FIG. 5 illustrates a diagram of an LCD according to the present invention.
Figure 6:
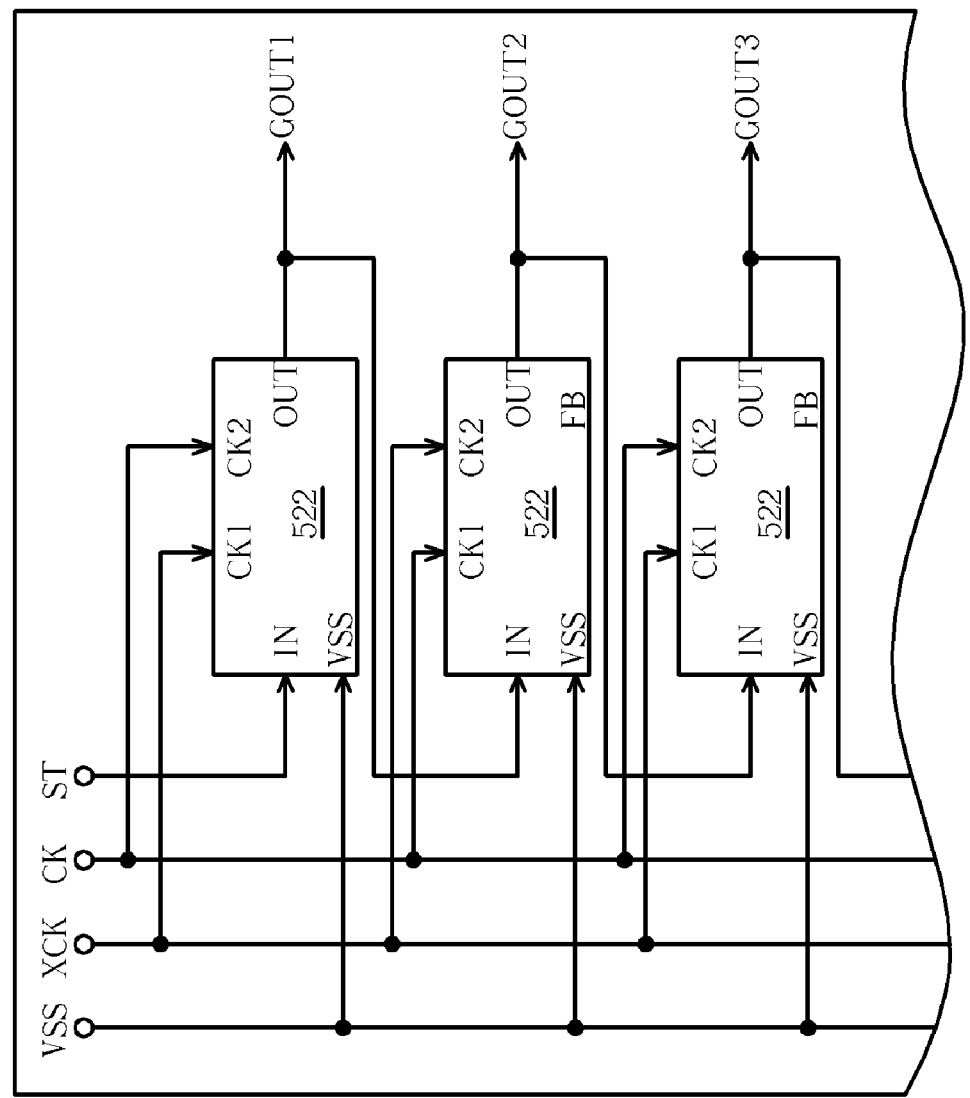
FIG. 6 illustrates a diagram of a gate driving circuit of the LCD of FIG. 5.
Figure 7:
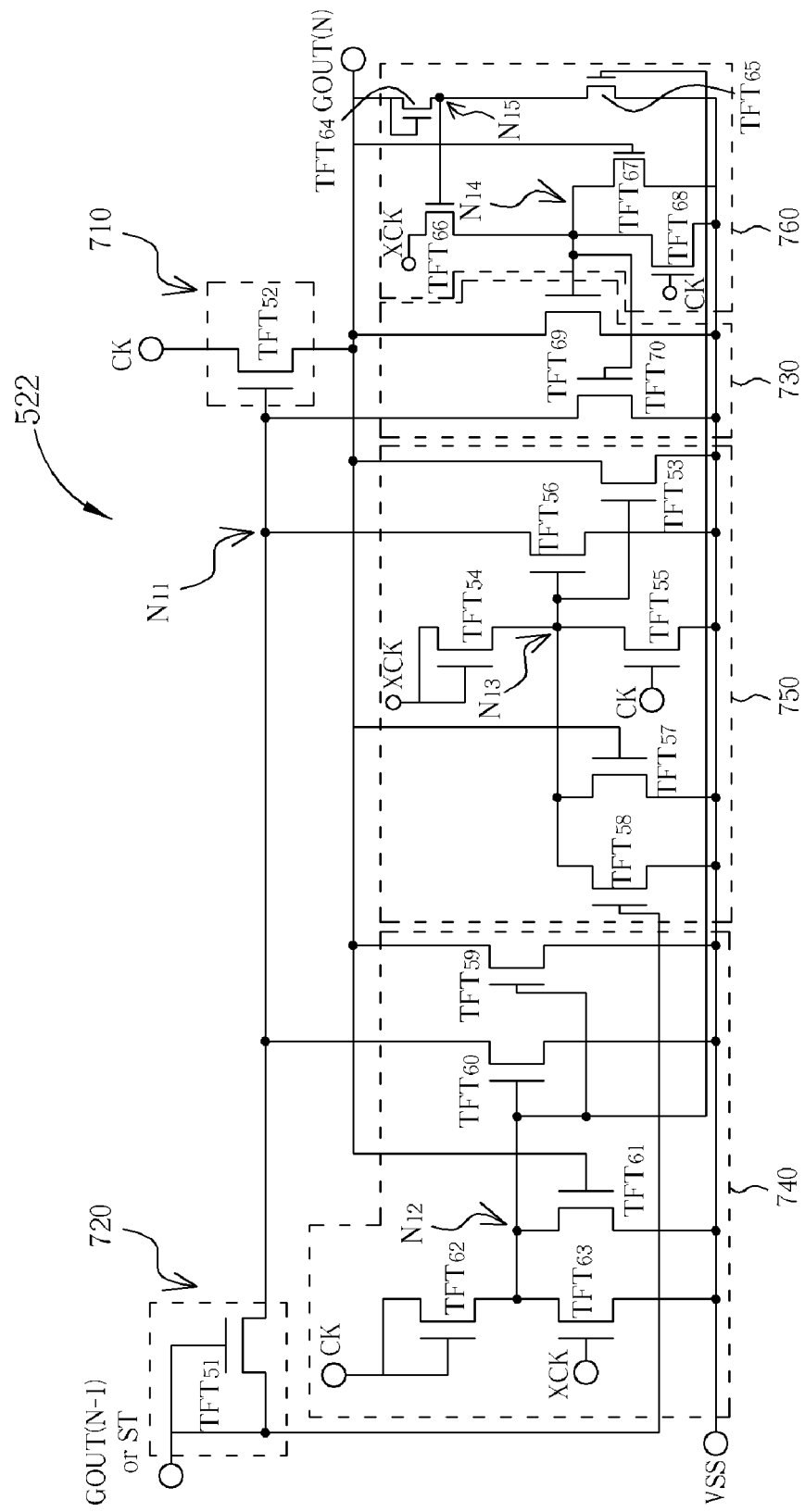
FIG. 7 illustrates a shift register of the gate driving circuit of FIG. 6.

Please refer to FIG. 5 to FIG. 7. FIG. 5 illustrates a diagram of an LCD 500 according to the present invention. FIG. 6 illustrates a diagram of a gate driving circuit 520 of the LCD 500 of FIG. 5. FIG. 7 illustrates a shift register of the gate driving circuit 520 of FIG. 6. The LCD 500 of the present invention includes a display array 510, and a gate driving circuit 520. The display array 510 is utilized for displaying images, and the gate driving circuit 520 is utilized for driving the display array 510. The gate driving circuit 520 includes a plurality of stage shift registers 522 coupled in series. And gate signals GOUT are generated by the plurality of stage shift registers 522 to drive the display array 510 in response to a first clock signal CK and a second clock signal XCK sequentially. Phase of the second clock signal XCK inter-compensates phase of the first clock signal CK. Regarding the connection of each stage shift register 522, the first clock signal CK and the second clock signal XCK alternately exchanges information, which means that a clock signal input end CK1 and a clock signal input end CK2 are alternately coupled to the first clock signal CK and the second clock signal XCK. The difference with the prior art is that in the present invention, each stage shift register 522 has an input end IN and an output end OUT, and without a feedback end FB. Each shift register 522 farther includes a signal generating circuit 710, a driving circuit 720, a primary reset circuit 730, a feedback circuit 760, and two secondary reset circuits 740, 750. As illustrated in FIG. 7, the signal generating circuit 710 is utilized for generating a gate signal GOUT(N) at the output end OUT of the shift register 522 in response to the first clock signal CK (which can also be the second clock signal XCK) while the signal generating circuit 710 is turned on. The driving circuit 720 is utilized for controlling the signal generating circuit 710 in response to the input signal from the input end IN of the shift register 522. The input signal from the input end IN of the shift register 522 is a start signal (ST) or a gate signal GOUT(N−1) from a previous stage shift register. The primary reset circuit 730 is utilized for turning off the signal generating circuit 710 and resetting the gate signal GOUT(N) from the output end OUT (which means that voltage of the output end is being lowered to a predetermined low potential VSS). The feedback circuit 760 is utilized for generating a feedback signal to control operation of the primary reset circuit 730 at point $N_{14}$ in response to the gate signal GOUT(N), the first clock signal CK and the second clock signal XCK. For example, $TFT_{66}$ of the feedback circuit 760 is utilized for generating a feedback signal in response to the second signal XCK at point N14 while the $TFT_{66}$ is turned on, and $TFT_{64}$ of the feedback circuit 760 is utilized for controlling on and off of the $TFT_{66}$ in response to the gate signal GOUT(N). Furthermore, $TFT_{67}$ and $TFT_{68}$ are respectively utilized for resetting the feedback signal in response to the gate signal GOUT(N) and the first clock signal CK, and $TFT_{65}$ of the feedback circuit 760 is the signal for resetting of the $TFT_{64}$ output end in response to voltage at point $N_{12}$. The secondary reset circuits 740, 750 are utilized for alternately turning off the signal generating circuit 710 and resetting the gate signal GOUT(N) from the output end OUT.

The feedback circuit 760 of each stage shift register 522 can generate a feedback signal to replace a gate signal GOUT (N+1) from the output end of a next shift register, which also means that the primary reset circuit 730 can turn off the signal generating circuit 710 and reset the gate signal GOUT(N) from the output end OUT in response to the feedback signal generated by the feedback signal 760, therefore it is not required that the output end OUT of the shift register be coupled to a feedback end of a previous shift register.

Figure 8:
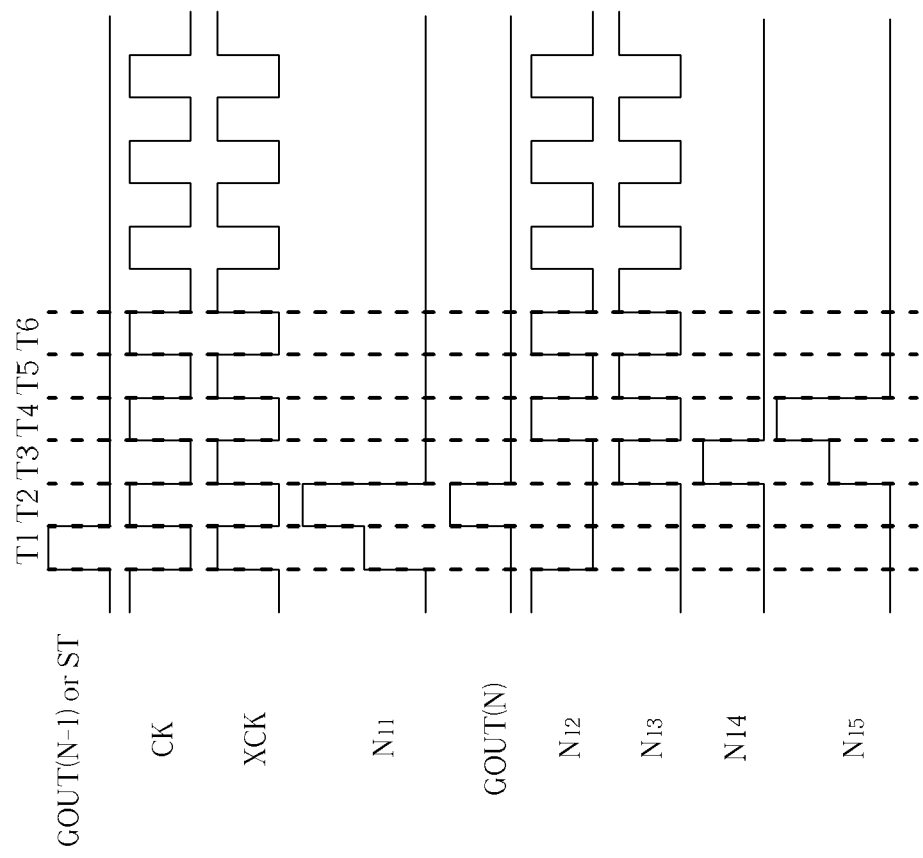
FIG. 8 illustrates a clock diagram of each related signal during operation of the shift register of FIG. 7.

To further explain the detailed operation of the shift register 522, please refer to FIG. 7 and FIG. 8 at the same time. FIG. 8 illustrates a clock diagram of each related signal during operation of the shift register 522 of FIG. 7. As illustrated in FIG. 8, in time T1, the input signal received by the input end IN (which can be the gate signal GOUT(N−1) or a start signal (ST) from the output end of a previous stage shift register) is being raised to a high electrical potential, hence $TFT_{51}$ of the driving circuit 720 is initialized as well as the signal generating circuit 710. However, the first clock signal CK at T1 is at low electrical potential, the gate signal GOUT(N) from the output end OUT remains at low electrical potential, the feedback circuit 760 is unable to initialize $TFT_{64}$ because the feedback signal GOUT (N+1) is at low electrical potential, which causes point $N_{15}$ to be low electrical potential, and the primary reset circuit 730 does not operate at point $N_{14}$ because electrical potential is low (which means that the feedback signal of the feedback circuit 760 is at low electrical potential), furthermore, the secondary reset circuit 740 does not operate at $N_{12}$ as electrical potential is low (which means that the first clock signal CK is at low potential), and because the input signal GOUT(N−1) or ST turns on $TFT_{58}$ at T1, the secondary reset circuit 750 does not operate at point $N_{13}$ as electrical potential is low.

At time T2, the input signal GOUT(N−1) or ST received by the input end IN is being lowered to low electrical potential, in doing so, $TFT_{15}$ of the driving circuit 720 is turned off, however, the signal generating circuit 710 is still turned on and electrical potential is raised to high electrical potential at $N_{11}$ due to electric capacitance on the first clock signal CK when the first clock signal CK is raised to high electrical potential. Additionally, at this time, the gate signal GOUT(N) from the output end OUT becomes high electrical potential, the feedback circuit 760 turns on $TFT_{64}$ because the gate signal GOUT(N) from the output end is at high electrical potential, therefore point N15 becomes high potential as well, and the primary reset circuit 730 does not operate at point $N_{14}$ because electrical potential is low, furthermore, because the gate signal GOUT(N) from the output end turns on $TFT_{61}$ at T2 the secondary reset circuit 740 does not operate at $N_{12}$ because electrical potential is low, and because the second clock signal XCK is at low potential the secondary reset circuit 750 does not operate at point $N_{13}$ because electrical potential is low.

At time T3, the second clock signal XCK is at high electrical potential, which directly causes point $N_{14}$ to rise to high electrical potential (which means that the feedback signal of the feedback circuit 760 is also at high electrical potential), point $N_{15}$ is raised to high electrical potential due to electric capacitance on the second clock signal XCK when the second clock signal XCK is raised to high electrical potential. The primary reset circuit 730 turns on $TFT_{69}$, $TFT_{70}$ because point N14 is at high electrical potential, which also means that the signal generating circuit 710 (point N11 is lowered to low electrical potential) is turned off and the gate signal GOUT (N) from the output end OUT is lowered to low electrical potential. Furthermore, because the first clock signal CK is at low electrical potential the secondary reset circuit 740 does not operate because point $N_{12}$ is at low electrical potential, but the secondary reset circuit 750 simultaneously turns on $TFT_{52}$, $TFT_{56}$ because point $N_{13}$ is at high electrical potential and turns off the signal generating circuit 710, and the gate signal GOUT(N) from the output end OUT is being lowered to low electrical potential.

At time T4, because $N_{12}$ is being raised to high electrical potential, point $N_{15}$ is being lowered to low electrical potential because $TFT_{65}$ is turned on, and because the first clock signal CK turns on $TFT_{68}$ at T4 the primary reset circuit 730 does not operate because point $N_{14}$ is being lowered to low electrical potential). Furthermore, after T3, the secondary reset circuit 740 and the secondary reset circuit 750 will alternately turn off the signal generating circuit 710 and lower the gate signal GOUT(N) from the output end to low electrical potential. Also, a next stage shift register 522 will also repeat the above-mentioned thereby sequentially generating the gate signal GOUT (which is also the output signal) to drive the display array 510.

In conclusion, the shift register 522 includes a feedback circuit 760 capable of self-feedback such that the primary reset circuit 730 can turn off the signal generating circuit 710 and reset the output signal (gate signal GOUT) in response the feedback signal generated from the feedback circuit 760.

In comparison to the prior art, it is not required that the output end OUT of the shift register 522 of the present invention be coupled to a feedback end of a previous shift register, thus workload of the output end OUT of each shift register 522 can be reduced so as to reduce rising time and falling time of the gate signal GOUT. Furthermore, a feedback end FB of a last stage shift register 522 of the gate driving circuit 520 is able to receive a feedback signal, therefore damage to the last stage shift register 522 or even the gate driving circuit 520 can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register, comprising:
   an output end;
   an input end;
   a signal generating circuit for generating an output signal at the output end in response to a clock signal while the signal generating circuit is turned on;
   a driving circuit, electrically coupled to the signal generating circuit, for controlling the signal generating circuit in response to an input signal from the input end;
   a primary reset circuit, electrically coupled to the signal generating circuit, for turning off the signal generating circuit and resetting an output signal from the output end; and
   a feedback circuit, electrically coupled to the output end and the primary reset circuit, for controlling the primary reset circuit in response to the output signal and the clock signal, wherein the feedback circuit comprises:
      a first thin film transistor (TFT) for outputting a feedback signal in response to the clock signal while the first TFT is turned on;
      a second TFT for controlling the first TFT in response to the output signal from the output end;
      a third TFT for resetting the feedback signal from the first TFT in response to the clock signal;

a fourth TFT for resetting the feedback signal from the first TFT in response to the output signal from the output end; and a fifth TFT for resetting the signal from the second TFT while the fifth TFT is turned on.

2. The shift register of claim 1, further comprising a secondary reset circuit, electrically coupled to the output end and the signal generating circuit, for turning off the signal generating circuit and resetting the output signal from the output end in response to the clock signal.

3. The shift register of claim 1, wherein the input end is electrically coupled to an output end of a previous stage shift register.

4. The shift register of claim 1, wherein the primary reset circuit comprises:

a sixth TFT for turning off the signal generating circuit while the sixth TFT is turned on by the feedback signal from the first TFT; and a seventh TFT for resetting the output signal from the output end while the seventh TFT is turned on by the feedback signal from the first TFT.

5. A thin film transistor (TFT) liquid crystal display (LCD), comprising:

a display array; and a gate driving circuit, having a plurality of stage shift registers coupled in a series, electrically connected to the display array, each stage shift register comprising:

an output end;

an input end;

a signal generating circuit for generating an output signal at the output end of the shift register while the signal generating circuit is turned on in response to a clock signal;

a driving circuit, electrically coupled to the signal generating circuit for controlling the signal generating circuit in response to an input signal from the input end;

a primary reset circuit, electrically coupled to the signal generating circuit for turning off the signal generating circuit and resetting an output signal from the output end; and a feedback circuit, electrically coupled to the output end and the primary reset circuit for controlling the primary reset circuit in response to the output signal and the clock signal, wherein the feedback circuit comprises:

a first thin film transistor (TFT) for outputting a feedback signal while the first TFT is turned in response to the clock signal;

a second TFT for controlling the first TFT in response to the output signal from the output end of the shift register;

a third TFT for resetting the feedback signal from the first TFT in response to the clock signal;

a fourth TFT for resetting the feedback signal from the first TFT in response to the output signal from the output end; and a fifth TFT for resetting the signal from the second TFT while the fifth TFT is turned on.

6. The LCD of claim 5, wherein the shift register further comprises a secondary reset circuit, electrically coupled to the output end and the signal generating circuit for turning off the signal generating circuit and resetting the output signal from the output end in response to the clock signal.

7. The LCD of claim 5, wherein the input end is, electrically coupled to an output end of a previous shift register.

8. The LCD of claim 5, wherein the primary reset circuit comprises:

a sixth TFT for turning off the signal generating circuit while the sixth TFT is turned on by the feedback signal from the first TFT; and a seventh TFT for resetting the output signal from the output end while the seventh TFT is turned on by the feedback signal from the first TFT.

* * * * *